(12) United States Patent
Gilet et al.

(10) Patent No.: US 12,315,848 B2
(45) Date of Patent: May 27, 2025

(54) OPTOELECTRONIC DEVICE COMPRISING MULTICOLOUR LIGHT-EMITTING DIODES AND A METHOD OF MANUFACTURING AN OPTOELECTRONIC DEVICE

(71) Applicant: ALEDIA, Échirolles (FR)

(72) Inventors: Philippe Gilet, Teche (FR); Vishnuvarthan Kumaresan, Voiron (FR)

(73) Assignee: ALEDIA, Échirolles (FR)

( * ) Notice: Subject to any disclaimer, the term of this patent is extended or adjusted under 35 U.S.C. 154(b) by 658 days.

(21) Appl. No.: 17/626,913

(22) PCT Filed: Jul. 10, 2020

(86) PCT No.: PCT/FR2020/051259
§ 371 (c)(1),
(2) Date: Jan. 13, 2022

(87) PCT Pub. No.: WO2021/009458
PCT Pub. Date: Jan. 21, 2021

(65) Prior Publication Data
US 2022/0359472 A1      Nov. 10, 2022

(30) Foreign Application Priority Data
Jul. 15, 2019   (FR) ..................................... 19/07963

(51) Int. Cl.
*H01L 25/075* (2006.01)
*H10H 20/01* (2025.01)
*H10H 20/813* (2025.01)

(52) U.S. Cl.
CPC ......... *H01L 25/0753* (2013.01); *H10H 20/01* (2025.01); *H10H 20/813* (2025.01)

(58) Field of Classification Search
CPC .............................. H01L 33/08; H01L 27/153
See application file for complete search history.

(56) References Cited

U.S. PATENT DOCUMENTS

| 2014/0166974 A1* | 6/2014 | Yoo | H01L 33/08 |
| | | | 257/13 |
| 2018/0374988 A1* | 12/2018 | Mi | H01L 33/0025 |
| 2020/0403375 A1* | 12/2020 | Wunderer | H01S 5/1234 |

FOREIGN PATENT DOCUMENTS

EP     2357676 A1     8/2011

OTHER PUBLICATIONS

International Search Report issued Oct. 8, 2020 re: Application No. PCT/FR2020/051259, pp. 1-3, citing: US 2018374988 A1, EP 2357676 A1, Wang et al. "Turnable, full color . . . " and Kishino et al. "Monolithic Integration . . . ".

(Continued)

*Primary Examiner* — Lex H Malsawma
*Assistant Examiner* — Bruce R. Smith
(74) *Attorney, Agent, or Firm* — CANTOR COLBURN LLP (57) ABSTRACT

An optoelectronic device includes a substrate, at least one first light-emitting diode and at least one second light-emitting diode, each first light-emitting diode having a first primary doped semiconductor portion, a first secondary active semiconductor portion, and a first tertiary doped semiconductor portion. Each second light-emitting diode includes a second primary doped semiconductor portion, a second secondary active semiconductor portion, and a second tertiary doped semiconductor portion. A first external lateral portion is configured to allow the first atomic species to diffuse until the first secondary active semiconductor portion reaches an atomic concentration of indium between 13% and 20%. A second external lateral portion is configured to allow the first atomic species to diffuse until the second secondary active semiconductor portion reaches an atomic concentration of indium between 20% and 40%.

25 Claims, 5 Drawing Sheets

(56) References Cited

OTHER PUBLICATIONS

Katsumi Kishino et al., "Monolithic Integration of InGaN-Based Nanocolumn Light-Emitting Diodes with Different Emission Colors", Applied Physics Express, Dec. 21, 2012, vol. 6, No. 1, , p. 012101-1-012101-3, XP055668991.

Renjie Wang et al., "Tunable, full-color nanowire light emitting diode arrays monolithically integrated on Si and sapphire", Proceedings of SPIE, Feb. 25, 2016, vol. 9748, pp. 97481S-1-97481S-9, XP060067672.

* cited by examiner

OPTOELECTRONIC DEVICE COMPRISING MULTICOLOUR LIGHT-EMITTING DIODES AND A METHOD OF MANUFACTURING AN OPTOELECTRONIC DEVICE

TECHNICAL FIELD

The present disclosure relates to an optoelectronic device comprising a substrate delimiting a support face, at least one first light-emitting diode and at least one second light-emitting diode formed on the support face, each of said first and second light-emitting diodes having an elongate three-dimensional shape along a longitudinal direction oriented transversely to the support face.

The present disclosure also relates to a method for manufacturing an optoelectronic device as such.

BACKGROUND

A light-emitting diode is a semiconductor light-emitting unit formed by a stacked structure of an N-type doped semiconductor layer, an active layer made of at least one semiconductor material and a P-type doped semiconductor layer.

The light-emitting diode structure may essentially consist of a 3D structure with a core-shell architecture or an axial architecture. The core-shell architecture is formed by an essentially vertical wire-type core made of a doped semiconductor having a first doping nature. An active layer emitting most of the light is formed over at least one portion of the core. A shell made of one or a plurality of doped semiconductor(s) having a second doping type covers the active layer partially or totally.

It is known that the active layer of a light-emitting diode may be composed of a plurality of semiconductor sublayers having a different forbidden band, such as quantum barrier sublayers alternating with quantum well sublayers. For example, the active layer of a light-emitting diode is formed by one single structure or a plurality of structures of a semiconductor made of a group III nitride formed on another semiconductor made of a group III nitride. Most of the active layers of light-emitting diodes are based on an InGaN alloy material.

In general, in order to match the wavelengths in an indium-based light-emitting diode, the composition ratio of indium or gallium in an InxGa(1-x)N compound of quantum well sublayers varies to control the wavelength of the emitted light. Nevertheless, it is difficult to reach the target amount of indium or gallium because it might vary according to many parameters such as the diameter of the light-emitting diode. Consequently, different light-emitting diodes with different diameters having grown under the same growth conditions will have a different amount of indium incorporated in the active layer, leading to the generation of parasitic wavelengths. In addition, the manufacturing costs could therefore be high to obtain a multi-colored light-emitting diode offering high emission quality because several growth steps will be necessary.

SUMMARY

Thus, the disclosure overcomes at least one of the drawbacks of the previously-described optoelectronic devices, in particular:

provide an optoelectronic device with light-emitting diodes having essentially the same diameters and emitting different wavelengths, accurately control the amount of indium obtained in the active layers of the light-emitting diodes, provide a method for obtaining an optoelectronic device having light-emitting diodes with essentially the same diameters and emitting different wavelengths, reduce the manufacturing costs of multicolored light-emitting diodes of an optoelectronic device.

This advantage can be achieved by implementing an optoelectronic device comprising a substrate delimiting a support face, at least one first light-emitting diode and at least one second light-emitting diode, each of said first and second light-emitting diodes being formed on the support face and having an elongate three-dimensional shape along a longitudinal direction D oriented transversely to the support face, each first light-emitting diode comprising:

a first primary doped semiconductor portion doped according to a first doping type and connected to the substrate, the first primary doped semiconductor portion delimiting a first outer lateral portion extending at least laterally around the first primary doped semiconductor portion, a first secondary active semiconductor portion formed at least partially on a distal end of the first primary doped semiconductor portion opposite, along the longitudinal direction D, to a proximal end formed on the support face, a first tertiary doped semiconductor portion doped according to a second doping type so that, when a voltage difference is applied between the first primary doped semiconductor portion and the first tertiary doped semiconductor portion, the first secondary active semiconductor portion emits a first light composed of a first range of wavelengths, each second light-emitting diode comprising:

a second primary doped semiconductor portion doped according to the first doping type and connected to the substrate, the second primary doped semiconductor portion delimiting a second outer lateral portion extending at least laterally around the second primary doped semiconductor portion, a second secondary active semiconductor portion formed at least partially on a distal end of the second primary doped semiconductor portion opposite, along the longitudinal direction D, to a proximal end formed on the support face, a second tertiary doped semiconductor portion doped according to the second doping type so that, when a voltage difference is applied between the second primary doped semiconductor portion and the second tertiary doped semiconductor portion, the second secondary active semiconductor portion emits a second light composed of a second range of wavelengths, the first outer lateral portion of the first primary doped semiconductor portion being configured to enable at least one first atomic species containing indium or gallium to diffuse from the first outer lateral portion to the first secondary active semiconductor portion during the formation of the first secondary active semiconductor portion until the first secondary active semiconductor portion reaches a first atomic concentration of indium comprised between 13% and 20%, the second outer lateral portion of the second primary doped semiconductor portion being configured to enable at least the first atomic species containing indium or gallium to diffuse from the second outer lateral portion to the second secondary active semiconductor portion during the formation of the second active secondary semiconductor portion until the second secondary active semiconductor portion reaches a second atomic concentration of indium comprised between 20% and 40%.

Some preferred non-limiting aspects of the optoelectronic device are described as follows.

In one implementation, the configuration of the first outer lateral portion consists in structuring its surface by means of plasma treatments or chemical reactions.

In one implementation, the first outer lateral portion of the first primary doped semiconductor portion is configured to enable the first atomic species containing indium or gallium to diffuse from the first outer lateral portion to the first secondary active semiconductor portion or to the distal end over a first diffusion length L1 and where the second outer lateral portion of the second primary doped semiconductor portion is configured to enable the first atomic species containing indium or gallium diffusing from the second outer lateral portion to the second secondary active semiconductor portion or to the distal end over a second diffusion length L2 different from the first diffusion length L1.

In one implementation, the first outer lateral portion is configured to have a first coefficient of adhesion, which represents the ratio between an amount of the first atomic species containing indium or gallium adsorbed on the first outer lateral portion and a total amount of the first atomic species containing indium or gallium arriving on the first outer lateral portion, and where the second outer lateral portion is configured to have a second coefficient of adhesion different from the first coefficient of adhesion, which represents the ratio between an amount of the first atomic species containing indium or gallium adsorbed on the second outer lateral portion and a total amount of the first atomic species containing indium or gallium arriving on the second outer lateral portion.

In one implementation, the first outer lateral portion comprises at least one first primary layer comprising a material different from the first primary doped semiconductor portion and having the first coefficient of adhesion or enabling at least the first atomic species containing indium or gallium to diffuse towards the first secondary active semiconductor portion or towards the distal end, during its formation, over the first diffusion length L1.

In one implementation, the second outer lateral portion comprises at least one second primary layer comprising a material different from the second primary doped semiconductor portion and having the second coefficient of adhesion or enabling at least the first atomic species containing indium or gallium to diffuse towards the second secondary active semiconductor portion or towards the distal end, during its formation, over the second diffusion length L2.

In one implementation, the first outer lateral portion further comprises a first secondary layer of the same nature as the second primary layer, the first primary layer 110a being formed on said first secondary layer.

In one implementation, the first primary layer is made at least of a SiOx alloy where 1≤x≤2, and the second primary layer is made at least of a SizNy alloy where 1≤y≤4 and 1≤z≤3.

In one implementation, the second atomic concentration of indium is comprised between 20% and 27%.

In one implementation, the optoelectronic device comprising at least one third light-emitting diode formed on the support face and having an elongate three-dimensional shape along the longitudinal direction D oriented transversely to the support face, each third light-emitting diode comprising:
a third primary doped semiconductor portion doped according to the first doping type and connected to the substrate, the third primary doped semiconductor portion delimiting a third outer lateral portion extending at least laterally around the third primary doped semiconductor portion,
a third secondary active semiconductor portion formed at least partially on a distal end of the primary doped third semiconductor portion opposite, along the longitudinal direction D, to a proximal end formed on the support face,
a third tertiary doped semiconductor portion doped according to the second doping type so that, when a voltage difference is applied between the third primary doped semiconductor portion and the third tertiary doped semiconductor portion, the third secondary active semiconductor portion emits a third light composed of a third range of wavelengths,
the third outer lateral portion of the third primary doped semiconductor portion being configured to enable at least the first atomic species containing indium or gallium to diffuse from the third outer lateral semiconductor portion to the third secondary active semiconductor portion during the formation of the third secondary active semiconductor portion until the third secondary active semiconductor portion reaches a third atomic concentration of indium comprised between 27% and 40%.

In one implementation, the third outer lateral portion is configured to enable the first atomic species containing indium or gallium to diffuse from the third outer lateral portion to the third secondary active semiconductor portion over a third diffusion length L3 different from the first diffusion length L1 and from the second diffusion length L2.

In one implementation, the third outer lateral portion is configured to have a third coefficient of adhesion different from the first coefficient of adhesion and the second coefficient of adhesion, which represents the ratio between an amount of the first atomic species containing indium or gallium adsorbed on the third outer lateral portion and a total amount of the first atomic species containing indium or gallium arriving on the third outer lateral portion.

In one implementation, the third outer lateral portion comprises at least one third primary layer comprising a material different from the first tertiary doped semiconductor portion and having the third coefficient of adhesion or enabling at least the first atomic species containing indium or gallium to diffuse from the third outer lateral portion to the third secondary active semiconductor portion over the third diffusion length L3.

In one implementation, the third outer lateral portion further comprises a third secondary layer of the same nature as the first primary layer, the third primary layer being formed over said third secondary layer.

In one implementation, the third outer lateral portion further comprises a third tertiary layer of the same nature as the second primary layer, the third primary layer being formed over the third tertiary layer.

In one implementation, the third primary layer is made at least of a TiOmNn alloy with 0≤m≤2 and 0≤n≤1.

In one implementation, at least one layer from the group comprising the first primary layer, the second primary layer and the third primary layer is made of an amorphous material.

In one implementation, at least one layer from the group comprising the first primary layer, the second primary layer and the third primary layer extends at least between two adjacent light-emitting diodes from the group comprising the first light-emitting diodes, the second light-emitting diodes and the third light-emitting diodes in a plane generally parallel to the support face.

This advantage can be achieved by implementing a method for manufacturing an optoelectronic device comprising a substrate delimiting a support face, at least one first light-emitting diode and at least one second light-emitting diode, each of the first and second light-emitting diodes being formed on the support face and having an elongate three-dimensional shape along a longitudinal direction D oriented transversely to the support face, the method comprising the following steps:

a) forming a first primary doped semiconductor portion of each first light-emitting diode doped according to a first doping type and connected to the substrate, the first primary doped semiconductor portion delimiting a first outer lateral portion extending at least laterally around the first primary doped semiconductor portion, the first outer lateral portion being configured to enable at least one first atomic species containing indium or gallium to diffuse from the first outer lateral portion to a first secondary active semiconductor portion or to the distal end during the formation of the first secondary active semiconductor portion, b) forming a second primary doped semiconductor portion of each second light-emitting diode doped according to the first doping type and connected to the substrate, the second primary doped semiconductor portion delimiting a second outer lateral portion extending at least laterally around the second primary doped semiconductor portion, the second outer lateral portion being configured to enable at least the first atomic species containing indium or gallium to diffuse from the second outer lateral portion to a second secondary active semiconductor portion or to the distal end during the formation of the second secondary active semiconductor portion, c) forming, using at least the first atomic species containing indium or gallium diffusing on the first outer lateral portion, from the first secondary active semiconductor portion at least partially on a distal end of the first primary doped semiconductor portion opposite, along the longitudinal direction D, to a proximal end formed on the support face, the first secondary active semiconductor portion comprising, at the end of step c), a first atomic concentration of indium comprised between 13% and 20%, d) forming, using at least the first atomic species containing indium or gallium diffusing on the second outer lateral portion, from the second secondary active semiconductor portion at least partially on a distal end of the second primary doped semiconductor portion opposite, along the longitudinal direction D, to a proximal end formed on the support face, the second secondary active semiconductor portion comprising, at the end of step d), a second atomic concentration of indium comprised between 20% and 40%, e) forming a first tertiary doped semiconductor portion doped according to a second doping type so that, when a voltage difference is applied between the first primary doped semiconductor portion and the first tertiary doped semiconductor portion, the first secondary active semiconductor portion emits a first light composed of a first range of wavelengths, f) forming a second tertiary doped semiconductor portion doped according to the second doping type so that, when a voltage difference is applied between the second primary doped semiconductor portion and the second tertiary doped semiconductor portion, the second secondary active semiconductor portion emits a second light composed of a second range of wavelengths.

Some preferred non-limiting aspects of the method are as follows.

Step c) and step d) are carried out at least partially during the same period.

The first outer lateral portion is configured to enable the first atomic species containing indium or gallium to diffuse from the first outer lateral portion to the first secondary active semiconductor portion over a first diffusion length L1 and where the second outer lateral portion of the second primary doped semiconductor portion is configured to enable the first atomic species containing indium or gallium to diffuse from the second outer lateral portion to the second secondary active semiconductor portion over a second length diffusion L2 different from the first diffusion length L1.

The first outer lateral portion is configured to have a first coefficient of adhesion, which represents the ratio between an amount of the first atomic species containing indium or gallium adsorbed on the first outer lateral portion and a total amount of the first atomic species containing indium or gallium arriving on the first outer lateral portion, and where the second outer lateral portion is configured to have a second coefficient of adhesion different from the first coefficient of adhesion, which represents the ratio between an amount of the first atomic species containing indium or gallium adsorbed on the second outer lateral portion and a total amount of the first atomic species containing indium or gallium arriving on the second outer lateral portion.

The second atomic concentration of indium is comprised between 20% and 27%.

The optoelectronic device comprising at least one third light-emitting diode formed on the support face and having an elongate three-dimensional shape along the longitudinal direction D oriented transversely to the support face, the method comprising the following additional steps:

g) forming a third primary doped semiconductor portion of each third light-emitting diode doped according to the first doping type and connected to the substrate, the third primary doped semiconductor portion delimiting a third outer lateral portion extending at least laterally around the third primary doped semiconductor portion, the third outer lateral portion of the third primary doped semiconductor portion being configured to enable at least the first atomic species containing indium or gallium to diffuse from the third lateral outer portion to a third secondary active semiconductor portion or to the distal end during the formation of the third secondary active semiconductor portion, h) forming, using at least the first atomic species containing indium or gallium diffusing on the third outer lateral portion, from the third secondary active semiconductor portion at least partially on a distal end of the third primary doped semiconductor portion opposite, along the longitudinal direction D, to a proximal end formed on the support face, the third secondary active semiconductor portion comprising, at the end of step h), a third atomic concentration of indium comprised between 27% and 40%, i) forming a third tertiary doped semiconductor portion doped according to the second doping type so that, when a voltage difference is applied between the third primary doped semiconductor portion and the third tertiary doped semiconductor portion, the third secondary active semiconductor portion emits a third light composed of a third range of wavelengths.

Step h) is carried out at least partially during the same period as step c) and step d).

The third outer lateral portion is configured to enable the first atomic species containing indium or gallium to diffuse from the third outer lateral portion to the third secondary active semiconductor portion over a third diffusion length L3 different from the first diffusion length L1 and the second diffusion length L2.

The third outer lateral portion is configured to have a third coefficient of adhesion different from the first coefficient of adhesion and the second coefficient of adhesion, which represents the ratio between an amount of the first atomic species containing indium or gallium adsorbed on the third outer lateral portion and a total amount of the first atomic species containing indium or gallium arriving on the third outer lateral portion.

The method comprises at least one of the following additional steps:
- a1) forming at least one first primary layer of the first outer lateral portion so that the first primary layer enables at least the first atomic species containing indium or gallium to diffuse towards the first secondary active semiconductor portion or towards the distal end over the first diffusion length L1,
- b1) forming at least one second primary layer of the second outer lateral portion so that the second primary layer has the second coefficient of adhesion or enables at least the first atomic species containing indium or gallium to diffuse towards the second secondary active semiconductor portion or towards the distal end over the second diffusion length L2,
- g1) forming at least one third primary layer of the third outer lateral portion so that the third primary layer has the third coefficient of adhesion or enables at least the first atomic species containing indium or gallium to diffuse towards the third secondary active semiconductor portion or towards the distal end over the third diffusion length L3 where step a1) is carried out after step a), step b1) is carried out after step b) and step g1) is carried out after step g).

BRIEF DESCRIPTION OF THE DRAWINGS

The previous features and advantages, as well as others, will be discussed in detail in the following non-limiting description of dedicated embodiments in connection with the appended drawings, among which.

DETAILED DESCRIPTION OF THE DRAWINGS

For clarity, identical or similar elements have been designated by the same reference numerals in the various drawings and, furthermore, as usual in the representation of electronic circuits, the various drawings are not to scale. Furthermore, only those elements that are useful for understanding the present description have been presented and will be described. In particular, the means for bringing into contact the optoelectronic device, the substrate, the polarization and the control means are well known and will not be described.

In the following description, unless stated otherwise, the terms "essentially", "about" and "in the range of" mean "up to 10%, preferably up to 5%". In addition, the different embodiments described do not exclude each other and could be combined together.

In particular, the present application relates to optoelectronic devices having light-emitting diodes with a three-dimensional structure comprising three-dimensional elements, for example microwires, nanowires, or semiconductor elements in the form of conical or slender wires.

Figure 1:
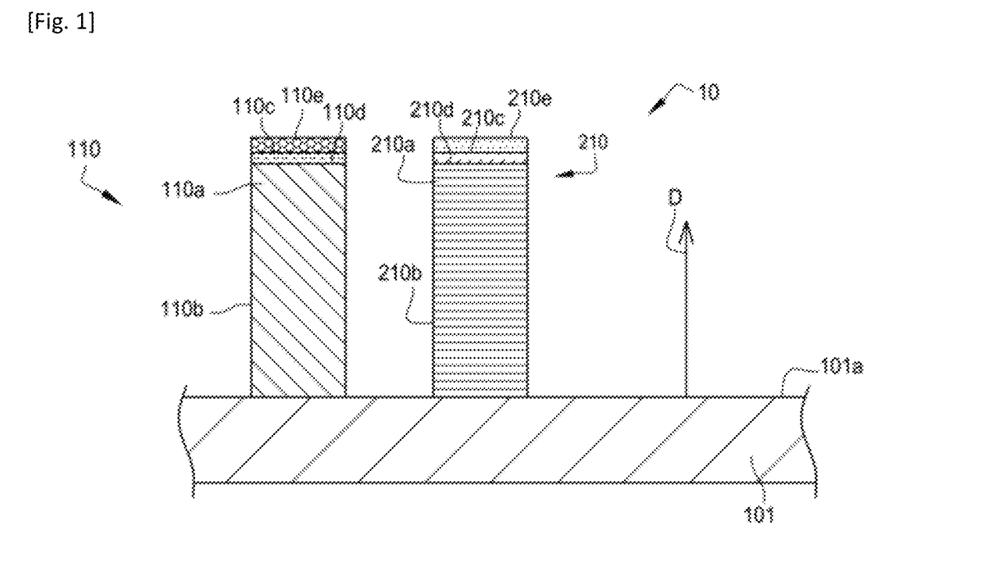
FIG. 1 illustrates a schematic cross-section of a first light-emitting diode and of a second light-emitting diode according to an embodiment of an optoelectronic device of the disclosure.

In particular, the present application relates to an optoelectronic device 10 as illustrated in FIG. 1. The optoelectronic device 10 comprises a substrate 101 delimiting a support face 101a. The optoelectronic device 10 also comprises at least one first light-emitting diode 110 and at least one second light-emitting diode 210. Each of said first and second light-emitting diodes 110, 210 is formed on the support face 101a and has an elongate three-dimensional shape along a longitudinal direction D oriented transversely to the support face 101a. The terms "formed on" mean "directly formed on" or "formed indirectly with the interposition of at least one layer". In the following description, embodiments are particularly described for light-emitting diodes having a three-dimensional shape comprising microwires or nanowires. However, such embodiments may be implemented for three-dimensional light-emitting diodes other than microwires or nanowires, for example conical or pyramidal three-dimensional light-emitting diodes. Three-dimension shaped light-emitting diodes have an elongate shape along the preferred direction called the longitudinal direction D. A second dimension, called the small dimension of the light-emitting diode, extends transversely to the longitudinal direction D and represents a diameter of the light-emitting diode. The dimension along the longitudinal direction D is in the range of 5 nm to 5 µm, preferably 50 nm to 2.5 µm, and is larger than or equal to 1 times, preferably larger than or equal to 5 times, and more preferably larger than or equal to 10 times the largest small dimension. In some embodiments, the small dimensions may be smaller than or equal to about 1 µm, preferably in the range of 70 nm to 1 µm, more preferably 100 nm to 800 nm. In some embodiments, the height of each three-dimensional light-emitting diode along the longitudinal dimension D may be larger than or equal to 500 nm, preferably in the range of 1 µm to 50 µm.

Each first light-emitting diode 110 comprises a first primary doped semiconductor portion 110a doped according to a first doping type, selected between a P doping type and an N doping type, and connected to the substrate 101. By "connected", it should be understood, in equivalent terms, "electrically connected" or "connected in an isolated manner by a physical contact" and/or "directly or indirectly connected". The first primary doped semiconductor portion 110a is formed at least partially from at least one semiconductor material such as silicon, germanium, silicon carbide, a III-V compound such as III-N compounds, a II-VI compound or a combination of these compounds. Examples of group III elements include gallium (Ga), indium (In) or aluminum (Al). Examples of III-N compounds are GaN, AlN, InN, InGaN, AlGaN or AlInGaN. Other elements of group V may also be used, for example phosphorus or arsenic. In general, the elements made of a compound III-V may be combined with different mole fractions. Examples of group II elements include an element of group IIA, in particular beryllium (Be) and magnesium (Mg) and elements of group IIB, in particular zinc (Zn) and cadmium (Cd). Examples of elements of group VI include elements of group VIA, in particular oxygen (0) and tellurium (Te). Examples of II-VI compounds are ZnO, ZnMgO, CdZnO or CdZn—MgO. In general, the elements made of a II-VI compound may be combined with different mole fractions. For example, for III-V compounds, the dopant may be selected from the group comprising a P-type dopant of group II, for example, magnesium (Mg), zinc (Zn), cadmium (Cd) or mercury (Hg), a P-type dopant of group IV, for example carbon (C) and an N-type dopant of group IV, for example silicon (Si), germanium (Ge), selenium (Se), sulfur (S), terbium (Tb) or tin (Sn).

The first primary doped semiconductor portion 110a delimits a first outer lateral portion 110b extending at least laterally around the first primary doped semiconductor portion 110a. In the following description, the outer lateral portions 110b refer to the lateral surfaces substantially parallel to the longitudinal direction D. In other words, the outer lateral portions 110b refer to the outer layers or surfaces having a normal vector substantially perpendicular to the longitudinal direction D. In the case of conical or pyramidal shapes, the outer lateral parts refer to the outer surfaces connecting the perimeter from the base of the light-emitting diode to the top.

Each first light-emitting diode 110 also comprises a first secondary active semiconductor portion 110c formed at least partially on a distal end 110d of the first primary doped semiconductor portion 110a opposite, along the longitudinal direction D, to a proximal end formed on the support face 101a.

According to one example, the first secondary active semiconductor portion 110c may comprise means for confining the electric charge carriers such as a quantum well and/or quantum barriers. In one example, the first secondary active semiconductor portion 110c may be essentially made, at the end of its formation, based on a II-VI compound or a III-V compound but preferably from a III-V alloy and more particularly made from an InwGa(1-w)N alloy, where w is less than or equal to 1. Hence, the atomic concentration of indium in the first secondary active semiconductor portion 110c is linked to the concentration of gallium in the alloy during and at the end of the formation of the InwGa(1-w)N alloy. The first secondary active semiconductor portion 110c may be formed using incoming atomic species based on indium and/or gallium such as trimethylindium (TMIn) as the source of indium and/or triethylgallium gas (TEGa) or trimethylgallium (TMGa) as gallium sources or by direct heating of metal sources/ingots using effusion cells. Indium atoms adsorb and desorb at the level of a surface of the first secondary active semiconductor portion 110c, 110a, 110b, 110d and are incorporated at a given rate in the first secondary active semiconductor portion 110c to form the InwGa(1-w)N alloy. The atomic concentration of indium and/or gallium changes during the formation of the first secondary active semiconductor portion 110c according to many parameters, such as the amount of indium atoms available at the level of the surface of the first secondary active semiconductor portion 110c and/or the temperature and/or the amount of surrounding gallium atoms available at the level of the surface of the first secondary active semiconductor portion 110c. The amount of indium atom species available at the level of the surface of the first secondary active semiconductor portion 110c depends mostly on the indium atomic species diffusing from the first outer lateral portion 110b of the first primary doped semiconductor portion 110a. In order to accurately control the amount of indium available at the level of the surface of the first secondary active semiconductor portion 110c, the first outer lateral portion 110b of the first primary doped semiconductor portion 110a is configured to enable at least one first atomic species containing indium or gallium, originating from the sources of indium or gallium, to diffuse from the first outer lateral portion 110b to the first secondary active semiconductor portion 110c during the formation of the first secondary active semiconductor portion 110c until the first secondary active semiconductor portion 110c reaches a first atomic concentration of indium comprised between 13% and 20%.

Such a configuration of the first outer lateral portion 110b is advantageous to accurately control the atomic concentration of indium in the first secondary active semiconductor portion 110c during its formation. The control of the amount of the indium atomic species diffusing from the first outer lateral portion 110b is advantageous to control the atomic concentration of indium in the first secondary active semiconductor portion 110c during its formation. The target atomic concentration of indium during the formation of the first secondary active semiconductor portion 110c is comprised between 13% and 20%, therefore the amount of indium diffusing from the first outer lateral portion 110b should be kept quite low.

In one example, the configuration of the first outer lateral portion 110b consists in structuring its surface by means of plasma treatments or chemical reactions. The rougher or more raised the first outer lateral portion 110b, the lower will be the amount of indium species that could diffuse from the first outer lateral portion 110b to participate in the formation of the first secondary active semiconductor portion 110c.

In one example, the configuration of the first outer lateral portion 110b consists of forming the suitable material with which the first outer lateral portion 110b is made. This material will enable the first atomic species containing indium or gallium to diffuse from the first outer lateral portion 110b to the first secondary active semiconductor portion 110c over a first diffusion length L1. The first diffusion length L1 may be comprised between 5 nm and 5 µm in order to keep the diffusion length L1 relatively limited in order to limit the amount of indium atomic species that diffuses from the first outer lateral portion 110b to the first secondary active semiconductor portion 110c. Indeed, the atomic concentration of indium in the first secondary active semiconductor portion 110c should be kept comprised between 13% and 20%, therefore, it is advantageous to have a limited diffusion length L1 to prevent the atomic species of indium, which are located at a distance farther than the diffusion length L1, from reaching the first secondary active semiconductor portion 110c, thus limiting the amount of indium available during the formation of the first secondary active semiconductor portion 110c.

In one example, the configuration of the first outer lateral portion 110b consists in forming the material, with which the first outer lateral portion 110b is made, so that the material has a first coefficient of adhesion. The first coefficient of adhesion represents the ratio between an amount of the first atomic species containing indium or gallium adsorbed on the first outer lateral portion 110b and a total amount of the first atomic species containing indium or gallium arriving on the first outer lateral portion 110b. The first coefficient of adhesion is comprised between 0 and 1, but, preferably, kept rather low so that the amount of the first atomic species containing indium that adsorbs on the first outer lateral portion 110b and then diffuses towards the first secondary active semiconductor portion 110c, leads to an atomic concentration of indium kept in a low ratio comprised between 13 and 20%.

In one example, the first outer lateral portion 110b comprises at least one first primary layer 110ba comprising a material different from the first primary doped semiconductor portion 110a. The first primary layer 110ba has the first coefficient of adhesion or enables at least the first atomic species containing indium or gallium to diffuse towards the first secondary active semiconductor portion 110c, during its formation, over the first diffusion length L1. This architecture is advantageous because different three-dimension shaped light-emitting diodes of the optoelectronic device 10 could contain different primary layers made of different materials and then different diffusion lengths or different coefficients of adhesion could be obtained. Therefore, this leads to different atomic concentrations of indium or gallium in the different respective active semiconductor portions of the light-emitting diodes.

In one example, the first primary layer 110ba is made at least of a SiOx alloy where 1≤x≤2.

Each first light-emitting diode 110 also comprises a first tertiary doped semiconductor portion 110e doped according to a second doping type so that, when a voltage difference is applied between the first primary doped semiconductor portion 110a and the first tertiary doped semiconductor portion 110e, the first secondary active semiconductor portion 110c emits a first light composed of a first range of wavelengths. The atomic concentration of indium and therefore the concentration of gallium, which are bound by the composition of the $In_wGa_{1-w}N$ alloy, define the first range of wavelengths. The first atomic concentration of indium being comprised between 13% and 20%, it implies a range of the first emitted wavelength comprised between 430 and 490 nm which is in the blue-color range.

The second light-emitting diode 210 comprises a second primary doped semiconductor portion 210a doped according to the first doping type and connected to the substrate 101. In one example, the second primary doped semiconductor portion 210a is formed with the same material composition and generally with the same dimensions as the first primary doped semiconductor portion 110a of the first light-emitting diode 110.

The second primary doped semiconductor portion 210a defines a second outer lateral portion 210b which extends at least laterally around the second primary doped semiconductor portion 210a.

The optoelectronic device 10 also comprises a second secondary active semiconductor portion 210c formed at least partially on a distal end 210d of the second primary doped semiconductor portion 210a opposite, along the longitudinal direction D, to a proximal end formed on the support face 101a. In one example, the second secondary active semiconductor portion 210c is made of a base material $In_pGa_{(1-p)}N$ similar to the first secondary active semiconductor portion 110c but with a different atomic concentration of indium and/or gallium, that is to say p is different from w and preferably p>w.

The second outer lateral portion 210b of the second primary doped semiconductor portion 210a is configured to enable, according to the same mechanisms as those explained for the first light-emitting diode 110, at least the first atomic species containing indium or gallium to diffuse from the second outer lateral portion 210b to the second secondary active semiconductor portion 210c during the formation of the second secondary active semiconductor portion 210c until the second secondary active semiconductor portion 210c reaches a second atomic concentration of indium comprised between 20% and 40%. By "comprised between 20% and 40%", it should be understood "strictly higher than 20% and lower than or equal to 40%".

Such a configuration of the second outer lateral portion 210b is advantageous for accurately controlling the atomic concentration of indium in the first secondary active semiconductor portion 210c during its formation. The control of the amount of the indium atomic species diffusing from the second outer lateral portion 210b is advantageous to control the atomic concentration of indium in the second secondary active semiconductor portion 210c during its formation. The target atomic concentration of indium during the formation of the second secondary active semiconductor portion 210c is comprised between 20% and 40%, therefore the amount of indium diffusing from the second outer lateral portion 210b should be kept larger than that in the case of the first light-emitting diode.

In one example, the configuration of the second outer lateral portion 210b consists in structuring its surface by means of plasma treatments or chemical reactions. The rougher or more raised the second outer lateral portion 210b, the lower will be the amount of indium species that could diffuse from the second outer lateral portion 210b to participate in the formation of the second secondary active semiconductor portion 210c.

In one example, the configuration of the second outer lateral portion 210b consists in forming the right material with which the second outer lateral portion 210b is made. This material will enable the first atomic species containing indium or gallium to diffuse from the second outer lateral portion 210b to the second secondary active semiconductor portion 210c over a second diffusion length L2 different from the first diffusion length L1. The second diffusion length L2 is preferably larger than the first diffusion length L1. The second diffusion length L2 may be comprised between 10 nm and 30 µm in order to keep the diffusion length L2 relatively large in order to improve the amount of indium atomic species that diffuses from the second outer lateral portion 210b to the second secondary active semiconductor portion 210c. Indeed, the atomic concentration of indium in the second secondary active semiconductor portion 210c should be kept comprised between 20% and 40%, therefore, it is advantageous to have a diffusion length L2 larger than the first diffusion length to enable the first atomic species of indium or gallium, which are located at a further distance than the diffusion length L2, to reach the second secondary active semiconductor portion 210c, thus increasing the amount of indium available during the formation of the second secondary active semiconductor portion 210c.

In one example, the configuration of the second outer lateral portion 210b consists in forming the material with which the second outer lateral portion 210b is made, so that the material has a second coefficient of adhesion. The second coefficient of adhesion represents the ratio between an amount of the first atomic species containing indium or gallium, originating from the sources of indium or gallium, adsorbed on the second outer lateral portion 210b and a total amount of the first atomic species containing indium or gallium arriving on the second outer lateral portion 210b. The second coefficient of adhesion is comprised between 0 and 1 but is different from the first coefficient of adhesion. The second coefficient of adhesion is preferably kept higher than the first coefficient of adhesion so that the amount of the first atomic species containing indium which is adsorbed on the second outer lateral portion 210b and then diffuses towards the second secondary active semiconductor portion 210c, leads to an atomic concentration of indium kept in a higher ratio comprised between 20 and 40%.

In one example, the second outer lateral portion 210b comprises at least one second primary layer 210ba comprising a material different from the second primary doped semiconductor portion 210a. The second primary layer 210ba may have the second coefficient of adhesion or enable at least the first atomic species containing indium or gallium to diffuse towards the second secondary active semiconductor portion 210c, during its formation, over the second diffusion length L2.

In one example, the second primary layer 210ba is made at least of a SizNy alloy where 1≤y≤4 and 1≤z≤3.

In another example, the second primary layer 210ba is made at least of a TiOmNn alloy with 0≤m≤2 and 0≤n≤1.

This architecture is advantageous because the first and second three-dimension shaped light-emitting diodes of the optoelectronic device 10 could contain different primary layers made of different materials and then different diffusion lengths or different coefficients of adhesion could be obtained. Hence, this leads to different atomic concentrations of indium or gallium in the respective different active semiconductor portions of the first and second light-emitting diodes during their formation. Hence, this could lead to the generation of different colors from different light-emitting diodes potentially having the same dimensions.

The optoelectronic device 10 also comprises a second tertiary doped semiconductor portion 210e doped according to the second doping type so that, when a voltage difference is applied between the second primary doped semiconductor portion 210a and the second semiconductor portion 210e and the second tertiary doped semiconductor portion 210e, the second secondary active semiconductor portion 210c emits a second light composed of a second range of wavelengths. The second atomic concentration of indium being comprised between 20% and 40%, it implies a range of the second emitted wavelength comprised between 490 and 750 nm which is in the green-red color range.

In a first embodiment illustrated in FIG. 1, the optoelectronic device 10 comprises at least one first light-emitting diode 110 and at least one second light-emitting diode 210 as described before.

In a second embodiment, the first outer lateral portion 110b of the first primary doped semiconductor portion 110a of at least one first light-emitting diode 110 of the optoelectronic device 10 is configured to enable the first atomic species containing indium or gallium to diffuse from the first outer lateral portion 110b to the first secondary active semiconductor portion 110c or to the distal end 110d before the formation of the first secondary active semiconductor portion 110c over the first diffusion length L1. In this embodiment, the second outer lateral portion 210b of the second primary doped semiconductor portion 210a of at least one second light-emitting diode 210 of the optoelectronic device 10 is configured to enable the first atomic species containing indium or gallium to diffuse from the second outer lateral portion 210b to the second secondary active semiconductor portion 210c or to the distal end 210d over the second diffusion length L2 different from the first diffusion length L1.

In a third embodiment, the first outer lateral portion 110b is configured to have the first coefficient of adhesion, and the second outer lateral portion 210b is configured to have the second coefficient of adhesion different from the first coefficient of adhesion.

Figure 2:
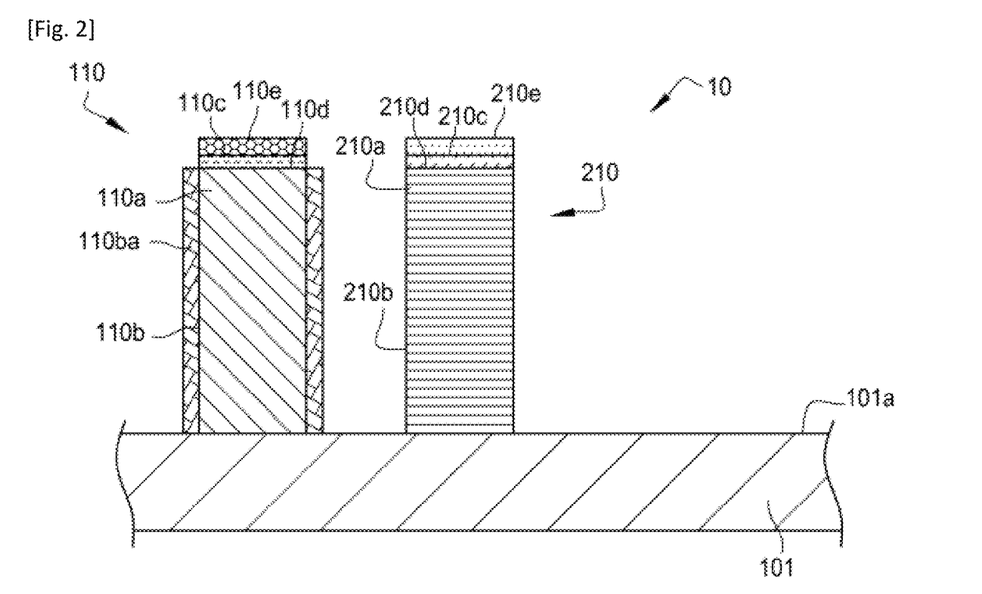
FIG. 2 represents a schematic cross-section of a first light-emitting diode and of a second light-emitting diode according to an embodiment of an optoelectronic device of the disclosure.

In a fourth embodiment illustrated in FIG. 2, the first outer lateral portion 110b, of at least one first light-emitting diode 110, comprises at least one first primary layer 110ba comprising a material different from the first primary doped semiconductor portion 110a and having the first coefficient of adhesion or enabling at least the first atomic species containing indium or gallium to diffuse towards the first secondary active semiconductor portion 110c or towards the distal end 110d, during its formation, over the first diffusion length L1.

In a fifth embodiment, the second outer lateral portion 210b, of at least one second light-emitting diode 210, comprises at least one second primary layer 210ba comprising a material different from the second primary doped semiconductor portion 210a and having the second coefficient of adhesion or enabling at least the first atomic species containing indium or gallium to diffuse towards the second secondary active semiconductor portion 210c or towards the distal end 210d, during its formation, over the second diffusion length L2.

Figure 3:
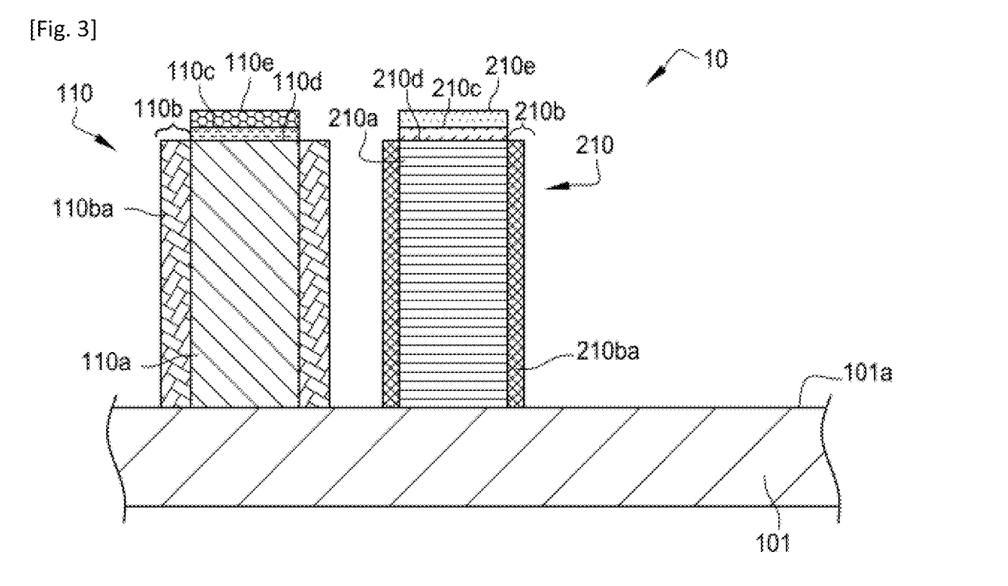
FIG. 3 represents a schematic cross-section of a first light-emitting diode and of a second light-emitting diode according to an embodiment of an optoelectronic device of the disclosure.

In a sixth embodiment illustrated in FIG. 3, at least one first light-emitting diode comprises at least one first primary layer 110ba comprising a material different from the first primary doped semiconductor portion 110a and having the first coefficient of adhesion or enabling at least the first atomic species containing indium or gallium to diffuse towards the first secondary active semiconductor portion 110c, during its formation, over the first diffusion length L1, and at least one second light-emitting diode 210, comprises at least one second primary layer 210ba comprising a material different from the second primary doped semiconductor portion 210a and having the second coefficient of adhesion or enabling at least the first atomic species containing indium or gallium to diffuse towards the second secondary active semiconductor portion 210c, during its formation, or 210*d* (before the formation of the second secondary active semiconductor portion 210*c*) over the second diffusion length L2.

Figure 4:
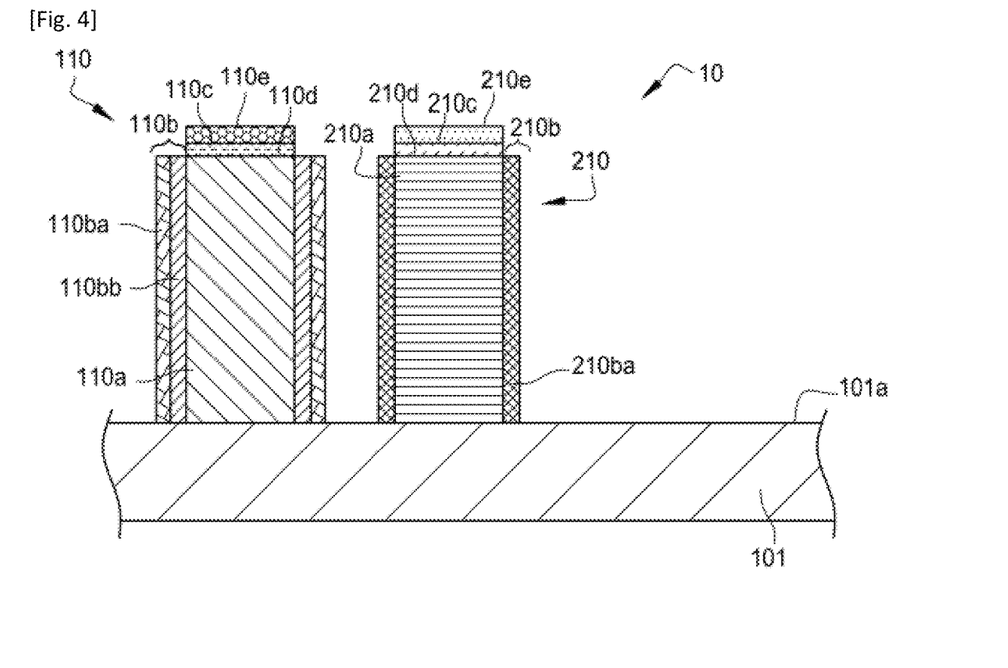
FIG. 4 represents a schematic cross-section of a first light-emitting diode and of a second light-emitting diode according to an embodiment of an optoelectronic device of the disclosure.

In a seventh embodiment illustrated in FIG. 4, the first outer lateral portion 110*b*, of at least one first light-emitting diode, further comprises a first secondary layer 110*bb* of the same nature as the second primary layer 210*ba* of at least one second light-emitting diode, the first primary layer 110*ba* being formed over said first secondary layer 110*bb*. By "formed over", it should be understood "formed directly over" or "formed indirectly with the interposition of at least one layer".

In one example, the first primary layer 110*ba* contains at least one SiOx alloy where 1≤x≤2 and the second primary layer 210*ba* contains at least one SizNy alloy where 1≤y≤4 and 1≤z≤3.

In another example, the first primary layer 110*ba* contains at least one SiOx alloy where 1≤x≤2 and the second primary layer 210*ba* contains at least one TiOmNn alloy with 0≤m≤2 and 0≤n≤1.

This embodiment is advantageous because at least two light-emitting diodes emitting different colors could be obtained in the same optoelectronic device by simply adding an additional layer on a light-emitting diode. Hence, the manufacturing cost is kept low in comparison with another manufacturing method for obtaining multi-colored light-emitting devices.

In the following embodiments, the second atomic concentration of indium of at least one second secondary active semiconductor portion 210*c* is comprised between 20% and 27%.

The second atomic concentration of indium comprised between 20% and 27% implies a generation of a wavelength comprised between 490 nm and 550 nm which corresponds to a green color emission for the second light-emitting diode 210 in the following embodiments.

Consequently, in the following embodiments, the second diffusion length L2 is reduced in comparison with the previous embodiment so that the amount of the first atomic species containing indium or gallium diffusing from the second outer lateral portion 210*b* to the second secondary active semiconductor portion 210*c* is limited to provide a second atomic concentration of indium in the second secondary active semiconductor portion 210*c* comprised between 20% and 27%.

Figure 5:
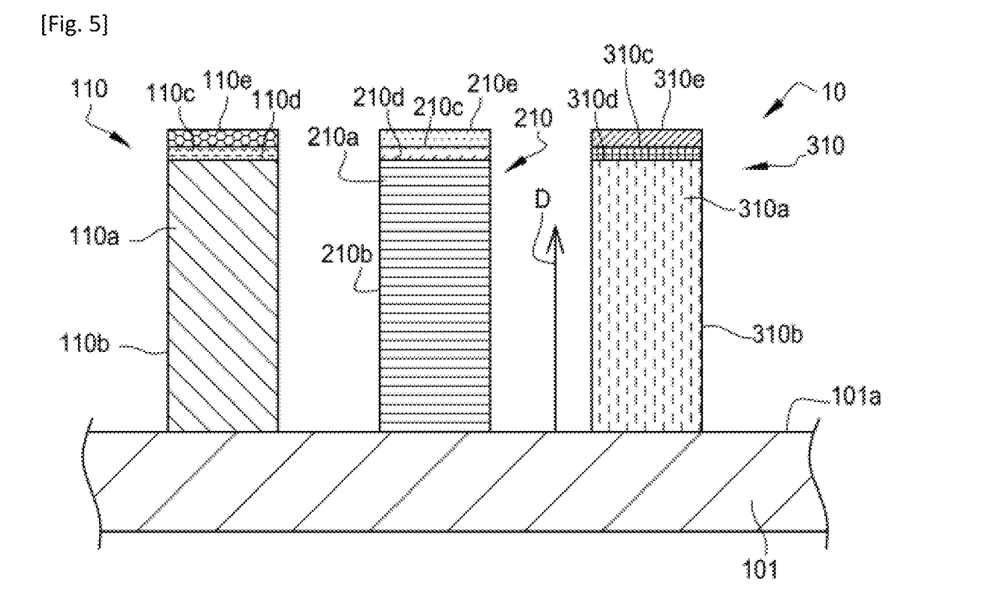
FIG. 5 represents a schematic cross-section of a first light-emitting diode and of a second light-emitting diode and a third light-emitting diode according to an embodiment of an optoelectronic device of the disclosure.

In an eighth embodiment illustrated in FIG. 5, the optoelectronic device 10 comprises at least one third light-emitting diode 310 formed on the support face 101*a* and having an elongate three-dimensional shape along the longitudinal direction D oriented transversely to the support face 101*a*, each third light-emitting diode 310 comprising:
- a third primary doped semiconductor portion 310*a* doped according to the first doping type and connected to the substrate 101, the third primary doped semiconductor portion 310*a* delimiting a third outer lateral portion 310*b* extending at least laterally around the third primary doped semiconductor portion 310*a*,
- a third secondary active semiconductor portion 310*c* formed at least partially on a distal end 310*d* of the third primary doped semiconductor portion 310*a* opposite, along the longitudinal direction D, to a proximal end formed on the support face 101*a*,
- a third tertiary doped semiconductor portion 310*e* doped according to the second doping type so that, when a voltage difference is applied between the third primary doped semiconductor portion 310*a* and the third tertiary doped semiconductor portion 310*e*, the third secondary active semiconductor portion 310*c* emits a third light composed of a third wavelength range, the third outer lateral portion 310*b* of the third primary doped semiconductor portion 310*a* being configured to enable at least the first atomic species containing indium or gallium to diffuse from the third outer lateral portion 310*b* to the third secondary active semiconductor portion 310*c* during the formation of the third secondary active semiconductor portion 310*c* until the third secondary active semiconductor portion 310*c* reaches a third atomic concentration of indium comprised between 27% and 40%. By "comprised between 27% and 40%", it should be understood "strictly higher than 27% and lower than or equal to 40%".

In one example, the first tertiary doped semiconductor portion 310*a* has a shape and a composition and/or dimensions similar to that(those) of a first primary doped semiconductor portion 110*a* and/or of a second primary doped semiconductor portion 210*a*.

In another example, the third tertiary doped semiconductor portion 310*e* has a nature and/or dimensions similar to that(those) of the third primary doped semiconductor portion 110*e* and/or of the third secondary doped semiconductor portion 210*e*.

In one example, the third secondary active semiconductor portion 310*c* is made of a base material IntGa(1-t)N 0≤t≤1 similar to the first secondary active semiconductor portion 110*c*, but with a different atomic concentration of indium and/or gallium, that is to say, t is different from w or p and preferably t>p>w.

The third atomic concentration of indium of the third secondary active semiconductor portion 310*c* comprised between 27% and 40% implies a generation of wavelength comprised between 550 nm and 750 nm which corresponds to a generation of red color.

In one example, the third outer lateral portion 310*b* is configured to enable the first atomic species containing indium or gallium to diffuse from the third outer lateral portion 310*b* to the third secondary active semiconductor portion 310*c* over a third diffusion length L3 different from the first diffusion length L1 and from the second diffusion length L2.

The third diffusion length L3 is preferably larger than the first diffusion length L1 and the second diffusion length L2. The third diffusion length L3 may be comprised between 10 nm and 50 µm in order to keep the diffusion length L3 larger than the second diffusion length L2. In order to increase the amount of indium atomic species that diffuses from the third outer lateral portion 310*b* to the third secondary active semiconductor portion 310*c* or to the distal end 310*d*, it is also advantageous that the third diffusion length L3 is larger than the first diffusion length L1 and the second diffusion length L2. Indeed, the atomic concentration of indium in the third secondary active semiconductor portion 310*c* must be kept comprised between 27% and 40%, therefore it is advantageous to have a diffusion length L3 larger than the second diffusion length L2 to enable the first atomic species of indium or gallium, which are located at a distance farther than the diffusion length L3, to reach the third secondary active semiconductor portion 310*c* or the distal end 310*d*, thus increasing the amount of d indium available during the formation of the third secondary active semiconductor portion 310*c*.

In one example, the configuration of the third outer lateral portion 310*b* consists in forming the material, with which the third outer lateral portion 310*b* is made, so that the material has a third coefficient of adhesion. The third coefficient of adhesion represents the ratio between an amount of the first atomic species containing indium or gallium, originating from the sources of indium or gallium, adsorbed on the third outer lateral portion 310b and a total amount of the first atomic species containing indium or gallium arriving on the third outer lateral portion 310b. The third coefficient of adhesion is comprised between 0 and 1 but is different from the first coefficient of adhesion and from the second coefficient of adhesion. The third coefficient of adhesion is preferably kept higher than the first and second coefficients of adhesion so that the amount of the first atomic species containing indium that is adsorbed on the third outer lateral portion 310b, and then diffuses towards the third active secondary semiconductor portion 310c, leads to an atomic concentration of indium kept in a higher ratio comprised between 27 and 40%.

Figure 6:
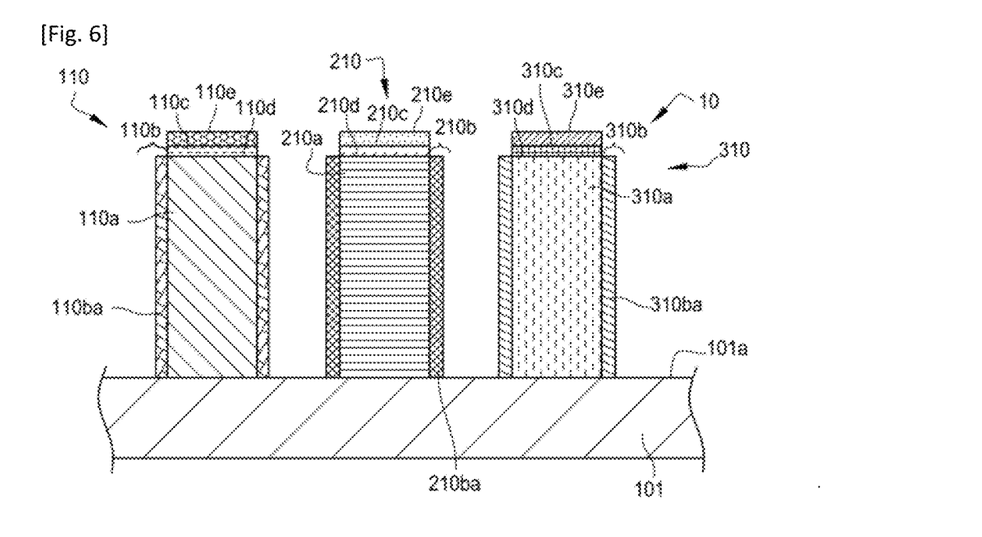
FIG. 6 represents schematic cross-sections of a first light-emitting diode and of a second light-emitting diode and of a third light-emitting diode according to an embodiment of an optoelectronic device of the disclosure.

In a ninth embodiment illustrated in FIG. 6, the third outer lateral portion 310b comprises at least one third primary layer 310ba comprising a material different from the first tertiary doped semiconductor portion 310a and having the third coefficient of adhesion or enabling at least the first atomic species containing indium or gallium to diffuse from the third outer lateral portion 310b to the third secondary active semiconductor portion 310c over the third diffusion length L3.

In a tenth embodiment, the third outer lateral portion 310b further comprises a third secondary layer 310bb of the same nature as the first primary layer 110ba, the third primary layer 310ba being formed over said third secondary layer 310bb.

Figure 8:
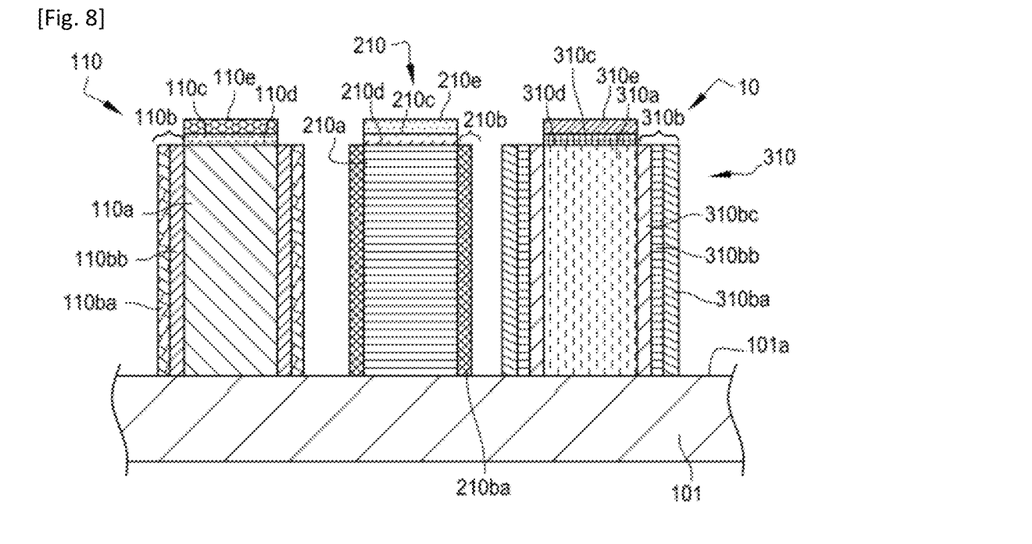
FIG. 8 represents schematic cross-sections of a first light-emitting diode and of a second light-emitting diode and of a third light-emitting diode according to an embodiment of an optoelectronic device of the disclosure.

In an eleventh embodiment, illustrated in FIG. 8, the third outer lateral portion 310b further comprises a third tertiary layer 310bc of the same nature as the second primary layer 210ba, the third primary layer 310ba being formed over the third tertiary layer 310bc.

In an example of this embodiment, at least one second light-emitting diode 210 comprises the second primary layer 210ba and at least one first light-emitting diode 110 comprises a first secondary layer 110bb of the same nature as the second primary layer 210ba, the first primary layer 110ba being formed over said first secondary layer 110bb.

This example is advantageous because it allows providing at least three different light-emitting diodes emitting three different colors but generally having the same dimensions and on the same substrate without any mechanical or transfer step.

In an example of the ninth to eleventh embodiments, the third primary layer 310ba is made at least of a TiOmNn alloy with 0≤m≤2 and 0≤n≤1.

In an example of the ninth to eleventh embodiments, at least one layer amongst the first primary layer 110ba and/or the second primary layer 210ba and/or the third primary layer 310ba is made of an amorphous material.

Figure 7:
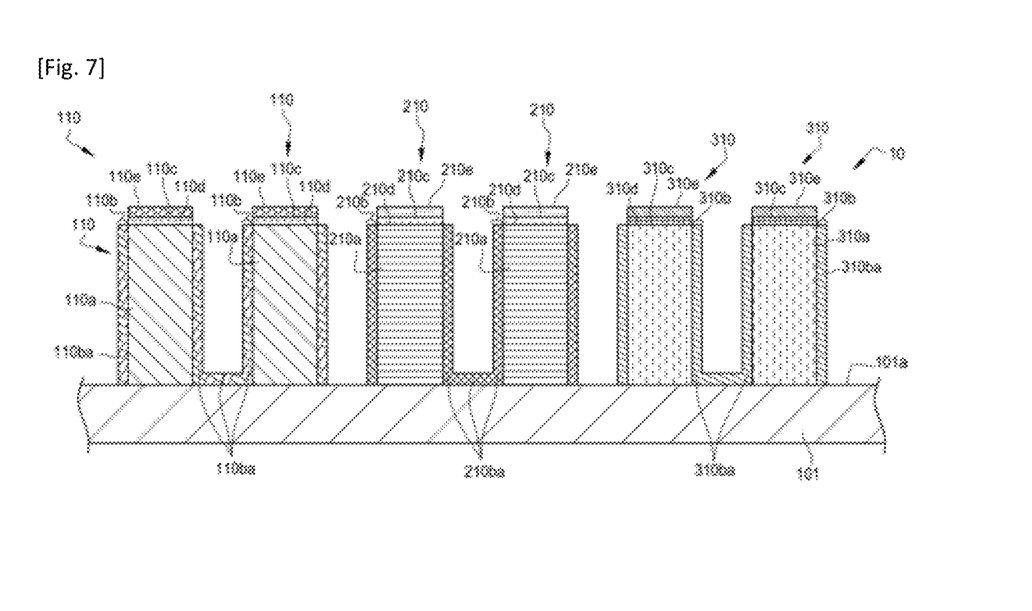
FIG. 7 represents schematic cross-sections of two adjacent first light-emitting diodes and of two adjacent second light-emitting diodes and of two adjacent third light-emitting diodes according to an embodiment of an optoelectronic device of the disclosure.

In an example of the ninth embodiment, as illustrated in FIG. 7, at least the first primary layer 110ba and/or the second primary layer 210ba and/or the third primary layer 310ba extends/extend at least between two adjacent light-emitting diodes from the group comprising the first light-emitting diodes 110, the second light-emitting diodes 210 and the third light-emitting diodes 310 in a plane generally parallel to the support face 101a.

This example is advantageous to ensure at the same time an electrical insulation between the light-emitting diodes.

The disclosure also relates to a method for manufacturing an optoelectronic device 10 where the optoelectronic device 10 comprises a substrate 101 delimiting a support face 101a, at least one first light-emitting diode 110 and at least one second light-emitting diode 210, each of the first and second light-emitting diodes 110, 210 being formed on the support face 101a and having an elongate three-dimensional shape along a longitudinal direction D oriented transversely to the support face 101a, the method comprising the following steps:

a) forming a first primary doped semiconductor portion 110a of each first light-emitting diode 110 doped according to a first doping type and connected to the substrate 101, the first primary doped semiconductor portion 110a delimiting a first outer lateral portion 110b extending at least laterally around the first primary doped semiconductor portion 110a, the first outer lateral portion 110b being configured to enable at least one first atomic species containing indium or gallium to diffuse from the first outer lateral portion 110b to a first secondary active semiconductor portion 110c or to the distal end 110d during the formation of the first secondary active semiconductor portion 110c, b) forming a second primary doped semiconductor portion 210a of each second light-emitting diode 210 doped according to the first doping type and connected to the substrate 101, the second primary doped semiconductor portion 210a delimiting a second outer lateral portion 210b extending at least laterally around the second primary doped semiconductor portion 210a, the second outer lateral portion 210b being configured to enable at least the first atomic species containing indium or gallium to diffuse from the second outer lateral portion 210b to a second secondary active semiconductor portion 210c or to the distal end 210d during the formation of the second secondary active semiconductor portion 110c, c) forming, using at least the first atomic species containing indium or gallium diffusing on the first outer lateral portion 110b, from the first secondary active semiconductor portion 110c at least partially on a distal end 110d of the first primary doped semiconductor portion 110a opposite, along the longitudinal direction D, to a proximal end formed on the support face 101a, the first secondary active semiconductor portion 110c comprising, at the end of step c, a first atomic concentration of indium comprised between 13% and 20%, d) forming, using at least the first atomic species containing indium or gallium diffusing on the second outer lateral portion 210b, from the second secondary active semiconductor portion 210c at least partially on a distal end 210d of the second primary doped semiconductor portion 210a opposite, along the longitudinal direction D, to a proximal end formed on the support face 101a, the second secondary active semiconductor portion 210c comprising, at the end of step d, a second atomic concentration of indium comprised between 20% and 40%, e) forming a first tertiary doped semiconductor portion 110e doped according to a second doping type so that, when a voltage difference is applied between the first primary doped semiconductor portion 110a and the first tertiary doped semiconductor portion 110e, the first secondary active semiconductor portion 110c emits a first light composed of a first range of wavelengths, f) forming a second tertiary doped semiconductor portion 210e doped according to the second doping type so that, when a voltage difference is applied between the second primary doped semiconductor portion 210a and the second tertiary doped semiconductor portion 210e, the second secondary active semiconductor portion 210c emits a second light composed of a second range of wavelengths.

In one example, step c) and step d) are carried out at least partially during the same period. This is advantageous to reduce the manufacturing cost.

In one embodiment of the method, the first outer lateral portion 110b is configured to enable the first atomic species containing indium or gallium to diffuse from the first outer lateral portion 110b to the first secondary active semiconductor portion 110c over a first diffusion length L1. In this embodiment, the second outer lateral portion 210b of the second primary doped semiconductor portion 210a is configured to enable the first atomic species containing indium or gallium to diffuse from the second outer lateral portion 210b to the second secondary active semiconductor portion 210c over a second diffusion length L2 different from the first diffusion length L1.

In an example of this embodiment, the first outer lateral portion 110b is configured to have the first coefficient of adhesion, and the second outer lateral portion 210b is configured to have the second coefficient of adhesion different from the first coefficient of adhesion.

In the following embodiments, the second atomic concentration of indium is comprised between 20% and 27%.

In one embodiment, the optoelectronic device 10 comprises at least one third light-emitting diode 310 formed on the support face 101a and having an elongate three-dimensional shape along the longitudinal direction D oriented transversely to the support face 101a, the method comprising the following additional steps:
  g) forming a third primary doped semiconductor portion 310a of each third light-emitting diode 310 doped according to the first doping type and connected to the substrate 101, the third primary doped semiconductor portion 310a delimiting a third outer lateral portion 310b extending at least laterally around the third primary doped semiconductor portion 310a, the third outer lateral portion 310b of the third primary doped semiconductor portion 310a being configured to enable at least the first atomic species containing indium or gallium to diffuse from the third outer lateral portion 310b to a third secondary active semiconductor portion 310c during the formation of the third secondary active semiconductor portion 310c,
  h) forming, using at least the first atomic species containing indium or gallium diffusing on the third outer lateral portion 310b, from the third secondary active semiconductor portion 310c at least partially on a distal end 310d of the third primary doped semiconductor portion 310a opposite, along the longitudinal direction D, to a proximal end formed on the support face 101a, the third secondary active semiconductor portion 310c comprising, at the end of step h), a third atomic concentration of indium comprised between 27% and 40%,
  i) forming a third tertiary doped semiconductor portion 310e doped according to the second doping type so that, when a voltage difference is applied between the third primary doped semiconductor portion 310a and the third tertiary doped semiconductor portion 310e, the third secondary active semiconductor portion 310c emits a third light composed of a third range of wavelengths.

In an example of this embodiment, step h) is carried out at least partially during the same period as step c) and step d). This is advantageous to reduce the manufacturing costs.

In one example, the third outer lateral portion 310b is configured to enable the first atomic species containing indium or gallium to diffuse from the third outer lateral portion 310b to the third secondary active semiconductor portion 310c over a third length of diffusion L3 different from the first diffusion length L1 and from the second diffusion length L2.

In one example, the third outer lateral portion 310b is configured to have a third coefficient of adhesion different from the first coefficient of adhesion and from the second coefficient of adhesion.

Figure 9:
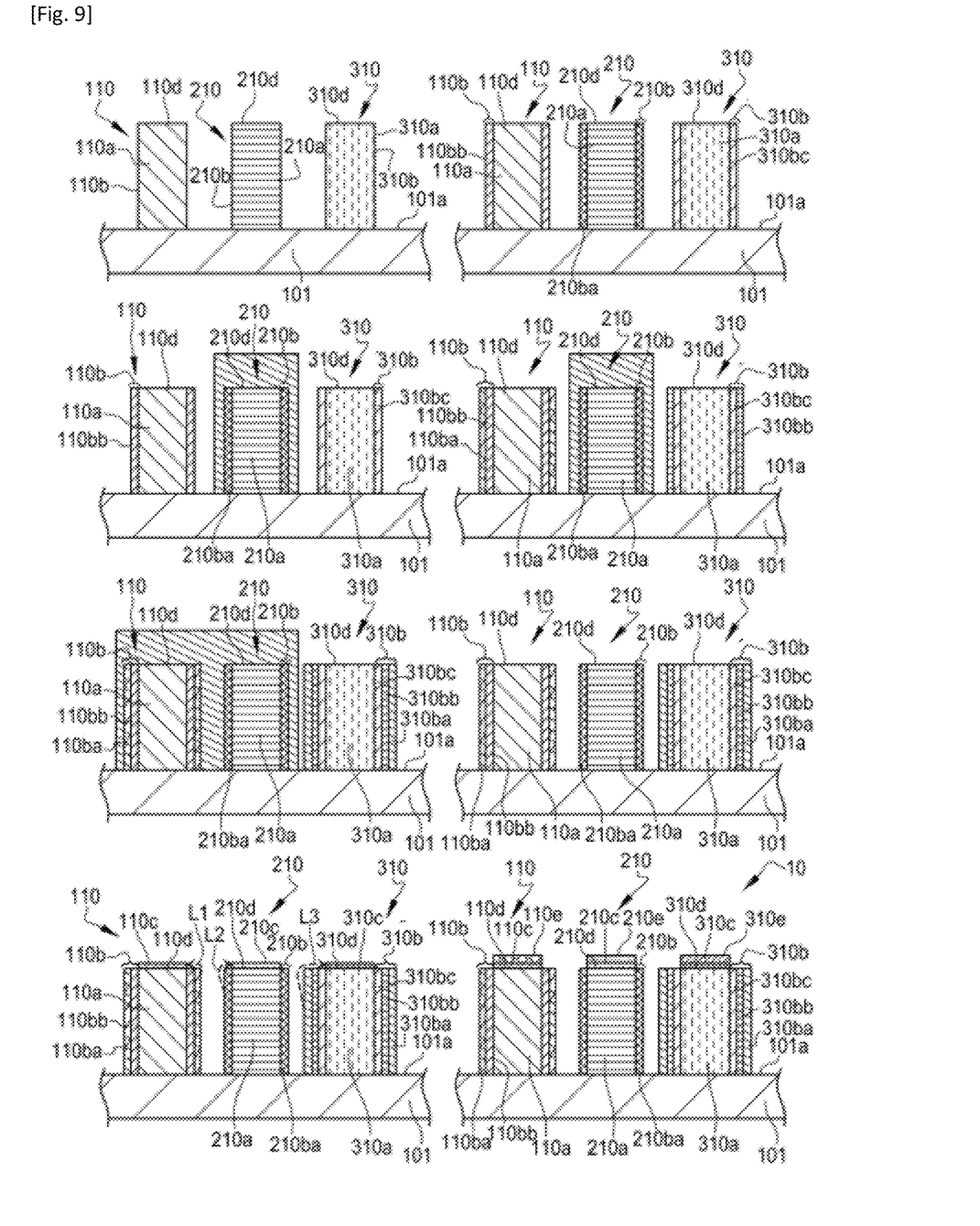
FIG. 9 represents different steps of a method for manufacturing an optoelectronic device according to an embodiment of the disclosure.

In a last embodiment illustrated in FIG. 9, the method comprises at least one of the following additional steps:
  a1) forming at least one first primary layer 110ba of the first outer lateral portion 110b such that the first primary layer 110ba enables at least the first atomic species containing indium or gallium to diffuse towards the first secondary active semiconductor portion 110c or towards the distal end 110d over the first diffusion length L1,
  b1) forming at least one second primary layer 210ba of the second outer lateral portion 210b so that the second primary layer 210ba has the second coefficient of adhesion or enables at least the first atomic species containing indium or gallium to diffuse towards the second secondary active semiconductor portion 210c or towards the distal end 210d over the second diffusion length L2,
  g1) forming at least one third primary layer 310ba of the third outer lateral portion such that the third primary layer 310ba has the third coefficient of adhesion or enables at least the first atomic species containing indium or gallium to diffuse towards the third secondary active semiconductor portion 310c over the third diffusion length L3 where step a1) is carried out after step a, step b1) is carried out after step b) and step g1) is carried out after step g).

As illustrated in FIG. 9, two successive steps of the method could be separated by one or several intermediate step(s) consisting in protecting with a resin one or several light-emitting diode(s) from the reception of the material referred to as belonging to the neighboring light-emitting diodes. Other intermediate steps consist in eliminating the protective resin. These intermediate steps are known to those skilled in the art and will not be described.

This method is advantageous because it shows how to obtain at least three different types of light-emitting diodes, each emitting a different color and generally having the same dimensions, on the same substrate and with common technologies.

It also reduces the manufacturing costs.

The disclosed embodiments are examples and could be combined together.

The invention claimed is:

1. An optoelectronic device comprising a substrate delimiting a support face, at least one first light-emitting diode and at least one second light-emitting diode, each of said first and second light-emitting diodes being formed on the support face and having an elongate three-dimensional shape along a longitudinal direction oriented transversely to the support face, each first light-emitting diode comprising:
  a first primary doped semiconductor portion doped according to a first doping type and connected to the substrate, the first primary doped semiconductor portion delimiting a first outer lateral portion extending at least laterally around the first primary doped semiconductor portion, a first secondary active semiconductor portion formed at least partially on a distal end of the first primary doped semiconductor portion opposite, along the longitudinal direction, to a proximal end formed on the support face, a first tertiary doped semiconductor portion doped according to a second doping type so that, when a voltage difference is applied between the first primary doped semiconductor portion and the first tertiary doped semiconductor portion, the first secondary active semiconductor portion emits a first light composed of a first range of wavelengths, each second light-emitting diode comprising:
a second primary doped semiconductor portion doped according to the first doping type and connected to the substrate, the second primary doped semiconductor portion delimiting a second outer lateral portion extending at least laterally around the second primary doped semiconductor portion, a second secondary active semiconductor portion formed at least partially on a distal end of the second primary doped semiconductor portion opposite, along the longitudinal direction, to a proximal end formed on the support face, a second tertiary doped semiconductor portion doped according to the second doping type so that, when a voltage difference is applied between the second primary doped semiconductor portion and the second tertiary doped semiconductor portion, the second secondary active semiconductor portion emits a second light composed of a second range of wavelengths, the first outer lateral portion of the first primary doped semiconductor portion being configured to enable at least one first atomic species containing indium or gallium to diffuse from the first outer lateral portion to the first secondary active semiconductor portion during the formation of the first secondary active semiconductor portion until the first secondary active semiconductor portion reaches a first atomic concentration of indium comprised between 13% and 20%, the second outer lateral portion of the second primary doped semiconductor portion being configured to enable at least the first atomic species containing indium or gallium to diffuse from the second outer lateral portion to the second secondary active semiconductor portion during the formation of the second secondary active semiconductor portion until the second secondary active semiconductor portion reaches a second atomic concentration of indium comprised between 20% and 40%, wherein the first outer lateral portion of the first primary doped semiconductor portion is configured to enable the first atomic species containing indium or gallium to diffuse from the first outer lateral portion to the first secondary active semiconductor portion or to the distal end over a first diffusion length and where the second outer lateral portion of the second primary doped semiconductor portion is configured to enable the first atomic species containing indium or gallium to diffuse from the second outer lateral portion to the second secondary active semiconductor portion or to the distal end over a second diffusion length different from the first diffusion length.

2. The optoelectronic device according to claims 1, wherein the first outer lateral portion is configured to have a first coefficient of adhesion, which represents the ratio between an amount of the first atomic species containing indium or gallium adsorbed on the first outer lateral portion and a total amount of the first atomic species containing indium or gallium arriving on the first outer lateral portion, and where the second outer lateral portion is configured to have a second coefficient of adhesion different from the first coefficient of adhesion, which represents the ratio between an amount of the first atomic species containing indium or gallium adsorbed on the second outer lateral portion and a total amount of the first atomic species containing indium or gallium arriving on the second outer lateral portion.

3. The optoelectronic device according to claim 2, wherein the first outer lateral portion comprises at least one first primary layer comprising a material different from the first primary doped semiconductor portion and having the first coefficient of adhesion or enabling at least the first atomic species containing indium or gallium to diffuse towards the first secondary active semiconductor portion or towards the distal end, during its formation, over the first diffusion length.

4. The optoelectronic device according to claim 2, wherein the second outer lateral portion comprises at least one second primary layer comprising a material different from the second primary doped semiconductor portion and having the second coefficient of adhesion or enabling at least the first atomic species containing indium or gallium to diffuse towards the second secondary active semiconductor portion or towards the distal end, during its formation, over the second diffusion length.

5. The optoelectronic device according to claim 4, wherein the first outer lateral portion further comprises a first secondary layer of the same nature as the second primary layer, the first primary layer being formed over said first secondary layer.

6. The optoelectronic device according to claim 4, wherein:
the first primary layer is made of at least one SiOx alloy where $1 \leq x \leq 2$, and
the second primary layer is made of at least one SizNy alloy where $1 \leq y \leq 4$ and $1 \leq z \leq 3$.

7. The optoelectronic device according to claim 1, wherein the second atomic concentration of indium is comprised between 20% and 27%.

8. The optoelectronic device according to claim 7, the optoelectronic device comprising at least one third light-emitting diode formed on the support face and having an elongate three-dimensional shape along the longitudinal direction oriented transversely to the support face,
each third light-emitting diode comprising:
a third primary doped semiconductor portion doped according to the first doping type and connected to the substrate, the third primary doped semiconductor portion delimiting a third outer lateral portion extending at least laterally around the third primary doped semiconductor portion, a third secondary active semiconductor portion formed at least partially on a distal end of the third primary doped semiconductor portion opposite, along the longitudinal direction, to a proximal end formed on the support face, and a third tertiary doped semiconductor portion doped according to the second doping type so that, when a voltage difference is applied between the third primary doped semiconductor portion and the third tertiary doped semiconductor portion, the third secondary active semiconductor portion emits a third light composed of a third range of wavelengths, the third outer lateral portion of the third primary doped semiconductor portion being configured to enable at least the first atomic species containing indium or gallium to diffuse from the third outer lateral portion to the third secondary active semiconductor portion during the formation of the third secondary active semiconductor portion until the third secondary active semiconductor portion reaches a third atomic concentration of indium comprised between 27% and 40%.

wherein the third outer lateral portion is configured to enable the first atomic species containing indium or gallium to diffuse from the third outer lateral portion to the third secondary active semiconductor portion over a third diffusion length different from the first diffusion length and from the second diffusion length.

9. The optoelectronic device according to claim 8, wherein the third outer lateral portion is configured to have a third coefficient of adhesion different from a first coefficient of adhesion and a second coefficient of adhesion, which represents the ratio between an amount of the first atomic species containing indium or gallium adsorbed on the third outer lateral portion and a total amount of the first atomic species containing indium or gallium arriving on the third outer lateral portion.

10. The optoelectronic device according to claim 9, wherein the third outer lateral portion comprises at least one third primary layer comprising a material different from the first tertiary doped semiconductor portion and having the third coefficient of adhesion or enabling at least the first atomic species containing indium or gallium to diffuse from the third outer lateral portion to the third secondary active semiconductor portion over the third diffusion length.

11. The optoelectronic device according to claim 10, wherein the third outer lateral portion further comprises a third secondary layer of the same nature as a first primary layer, the third primary layer being formed over said third secondary layer.

12. The optoelectronic device according to claim 11, wherein the third outer lateral portion further comprises a third tertiary layer of the same nature as a second primary layer, the third primary layer being formed over the third tertiary layer.

13. The optoelectronic device according to claim 10, wherein the third primary layer is made at least of a TiOmNn alloy with $0 \leq m \leq 2$ and $0 \leq n \leq 1$.

14. The optoelectronic device according to claim 10, wherein at least one layer from the group comprising the first primary layer, the second primary layer and the third primary layer is made of an amorphous material.

15. The optoelectronic device according to claim 10, wherein at least one layer from the group comprising the first primary layer, the second primary layer, and the third primary layer extend at least between two adjacent light-emitting diodes from the group comprising the first light-emitting diodes, the second light-emitting diodes, and the third light-emitting diodes in a plane generally parallel to the support face.

16. The optoelectronic device according to claim 1, wherein the configuration of the first outer lateral portion includes structuring its surface by plasma treatments or chemical reactions.

17. A method of manufacturing an optoelectronic device, wherein the optoelectronic device comprises a substrate delimiting a support face, at least one first light-emitting diode and at least one second diode light-emitting diode, each of the first and second light-emitting diodes being formed on the support face and having an elongate three-dimensional shape along a longitudinal direction oriented transversely to the support face, the method comprising the following steps:

a) forming a first primary doped semiconductor portion of each first light-emitting diode doped according to a first doping type and connected to the substrate, the first primary doped semiconductor portion delimiting a first outer lateral portion extending at least laterally around the first primary doped semiconductor portion, the first outer lateral portion being configured to enable at least one first atomic species containing indium or gallium to diffuse from the first outer lateral portion to a first secondary active semiconductor portion or to a distal end during the formation of the first secondary active semiconductor portion, b) forming a second primary doped semiconductor portion of each second light-emitting diode doped according to the first doping type and connected to the substrate, the second primary doped semiconductor portion delimiting a second outer lateral portion extending at least laterally around the second primary doped semiconductor portion, the second outer lateral portion being configured to enable at least the first atomic species containing indium or gallium to diffuse from the second outer lateral portion to a second secondary active semiconductor portion or to the distal end during the formation of the second secondary active semiconductor portion, c) forming, using at least the first atomic species containing indium or gallium diffusing on the first outer lateral portion, from the first secondary active semiconductor portion at least partially on one end distal of the first primary doped semiconductor portion opposite, along the longitudinal direction, to a proximal end formed on the support face, the first secondary active semiconductor portion comprising, at the end of step c), a first atomic concentration of indium comprised between 13% and 20%, d) forming, using at least the first atomic species containing indium or gallium diffusing on the second outer lateral portion, from the second secondary active semiconductor portion at least partially on one end distal of the second primary doped semiconductor portion opposite, along the longitudinal direction, to a proximal end formed on the support face, the second secondary active semiconductor portion comprising, at the end of step d), a second atomic concentration of indium comprised between 20% and 40%, e) forming a first tertiary doped semiconductor portion doped according to a second doping type so that when a voltage difference is applied between the first primary doped semiconductor portion and the first tertiary doped semiconductor portion, the first secondary active semiconductor portion emits a first light composed of a first range of wavelengths, and f) forming a second tertiary doped semiconductor portion doped according to the second doping type so that, when a voltage difference is applied between the second primary doped semiconductor portion and the second tertiary doped semiconductor portion, the second secondary active semiconductor portion emits a second light composed of a second range of wavelengths, wherein the first outer lateral portion is configured to enable the first atomic species containing indium or gallium to diffuse from the first outer lateral portion to the first secondary active semiconductor portion over a first diffusion length and where the second outer lateral portion of the second primary doped semiconductor portion is configured to enable the first atomic species containing indium or gallium to diffuse from the second outer lateral portion to the second secondary active semiconductor portion over a second diffusion length different from the first diffusion length.

18. The method according to claim 17, wherein step c) and step d) are carried out at least partially during the same period.

19. The method of claim 17, wherein the first outer lateral portion is configured to have a first coefficient of adhesion, which represents the ratio between an amount of the first atomic species containing indium or gallium adsorbed on the first outer lateral portion and a total amount of the first atomic species containing indium or gallium arriving on the first outer lateral portion, and where the second outer lateral portion is configured to have a second coefficient of adhesion different from the first coefficient of adhesion, which represents the ratio between an amount of the first atomic species containing indium or gallium adsorbed on the second outer lateral portion and a total amount of the first atomic species containing indium or gallium arriving on the second outer lateral portion.

20. The method according to claim 17, wherein the second atomic concentration of indium is comprised between 20% and 27%.

21. The method according to claim 20, wherein the optoelectronic device comprises at least one third light-emitting diode formed on the support face and having an elongate three-dimensional shape along the longitudinal direction oriented transversely to the support face, the method comprising the following additional steps:
  g) forming a third primary doped semiconductor portion of each third light-emitting diode doped according to the first doping type and connected to the substrate, the third primary doped semiconductor portion delimiting a third outer lateral portion extending at least laterally around the third primary doped semiconductor portion, the third outer lateral portion of the third primary doped semiconductor portion being configured to enable at least the first atomic species containing indium or gallium to diffuse from the third outer lateral portion to a third secondary active semiconductor portion or to the distal end during the formation of the third secondary active semiconductor portion,
  h) forming, using at least the first atomic species containing indium or gallium diffusing on the third outer lateral portion, from the third secondary active semiconductor portion at least partially on a distal end of the third primary doped semiconductor portion opposite, along the longitudinal direction, to a proximal end formed on the support face, the third secondary active semiconductor portion comprising, at the end of step h), a third atomic concentration of indium comprised between 27% and 40%, and
  i) forming a third tertiary doped semiconductor portion doped according to the second doping type so that when a voltage difference is applied between the third primary doped semiconductor portion and the third tertiary doped semiconductor portion, the third secondary active semiconductor portion emits a third light composed of a third range of wavelengths.

22. The method according to claim 21, wherein step h) is carried out at least partially during the same period as step c) and step d).

23. The method according to claim 21, wherein the third outer lateral portion is configured to enable the first atomic species containing indium or gallium to diffuse from the third outer lateral portion to the third secondary active semiconductor portion over a third diffusion length different from the first diffusion length and from the second diffusion length.

24. The method according to claim 21, wherein the third outer lateral portion is configured to have a third coefficient of adhesion different from a first coefficient of adhesion and a second coefficient of adhesion, which represents the ratio between an amount of the first atomic species containing indium or gallium adsorbed on the third outer lateral portion and a total amount of the first atomic species containing indium or gallium arriving on the third outer lateral portion.

25. The method according to claim 24, comprising at least one of the following additional steps:
  a1) forming at least one first primary layer of the first outer lateral portion such that the first primary layer enables at least the first atomic species containing indium or gallium to diffuse towards the first secondary active semiconductor portion or towards the distal end over the first diffusion length,
  b1) forming at least one second primary layer of the second outer lateral portion so that the second primary layer has the second coefficient of adhesion or enables at least the first atomic species containing indium or gallium to diffuse towards the second secondary active semiconductor portion or towards the distal end over the second diffusion length, and
  g1) forming at least one third primary layer of the third outer lateral portion such that the third primary layer has the third coefficient of adhesion or enables at least the first atomic species containing indium or gallium to diffuse towards the third secondary active semiconductor portion or towards the distal end over a third diffusion length where step a1) is carried out after step a), step b1) is carried out after step b) and step g1) is carried out after step g).

* * * * *